(12) United States Patent
Tomomatsu

(10) Patent No.: US 6,680,513 B2
(45) Date of Patent: Jan. 20, 2004

(54) SEMICONDUCTOR DEVICE

(75) Inventor: Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/216,361

(22) Filed: Aug. 12, 2002

(65) Prior Publication Data

US 2003/0146493 A1 Aug. 7, 2003

(30) Foreign Application Priority Data

Feb. 5, 2002 (JP) ......................................... 2002-028300

(51) Int. Cl.[7] .............................................. H01L 23/62
(52) U.S. Cl. ......................... 257/359; 257/360; 257/356
(58) Field of Search ................................. 257/359, 360, 257/356

(56) References Cited

U.S. PATENT DOCUMENTS 6,246,092 B1 * 6/2001 Fujihira et al. ............. 257/341

* cited by examiner

*Primary Examiner*—Jerome Jackson
(74) *Attorney, Agent, or Firm*—Oblon, Spivak, McClelland, Maier & Neustadt, P.C.

(57) ABSTRACT

A semiconductor device has a first IGBT (1) for controlling a principal current and a second IGBT (2) for preventing an over-current of the first IGBT (1). A diode portion (11) is disposed between the emitter (5) of the first IGBT (1) and the emitter (6) of the second IGBT (2) so as to be in parallel with a sensing resistor (8). The diode portion (11) is composed of a first diode (9) and a second diode (10), which are connected in reverse series to each other. In order to prevent the over-current of the first IGBT (1) and the destruction of the second IGBT (2), each of the diodes (9, 10) has a breakdown voltage in the reverse voltage direction, which is lower than the endurance voltage between the emitters (5, 6) and is higher than the upper limit of the voltage sensed by the sensing resistor (8).

6 Claims, 7 Drawing Sheets

SEMICONDUCTOR DEVICE

This application is based on the application No. 2002-028300 filed in Japan, the contents of which are hereby incorporated by reference.

BACKGROUND OF THE INVENTION

1. Field of the Invention

The present invention relates to a semiconductor device incorporating a current-sensing element for preventing an over-current and further including an insulated-gate transistor such as an IGBT (Insulated Gate Bipolar Transistor), a MOSFET (Metal Oxide Semiconductor Field Effect Transistor) or the like which has a means for protecting the current-sensing device from being destroyed by an over-voltage.

2. Description of the Prior Art

In recent years, an insulated-gate transistor (voltage-driven transistor) such as an IGBT, a MOSFET or the like has been widely used as a switching element etc. such as an inverter, an AC servo or the like, because it can execute a high-speed switching operation. In general, the insulated-gate transistor described above is provided with a current-sensing element in order to prevent that an over-current flows through a circuit, an external load or the like.

To be concrete, for example, in each of the Japanese Laid-Open Patent Publications Nos. 9-293856, 4-326768, 20002-69489, 8-46193 and 6-13618, there has been proposed an IGBT device or MOSFET device, which incorporates a current-sensing element for detecting a current flowing through a principal IGBT or a principal MOSFET to control a principal current, and prevents an over-current by lowering the gate voltage of the principal IGBT or the principal MOSFET when the current sensing element has detected a rise of the current in the principal IGBT or the principal MOSFET.

FIG. 7 is a circuit diagram showing a rough construction of a conventional semiconductor device (IGBT device) of a general type, which incorporates a current-sensing element. As shown in FIG. 7, in the conventional semiconductor device, a first IGBT 101 for controlling the principal current and a second IGBT 102 (current-sensing element) for monitoring the current flowing through the first IGBT 101 are formed together on one semiconductor substrate (not shown). In the semiconductor device, each of a gate 103 and a collector 104 is common with both the IGBTs 101 and 102.

On the other hand, each of the two IGBTs 101 and 102 is provided with a respective emitter. That is, a first emitter 105 is provided for the first IGBT 101 while a second emitter 106 is provided for the second IGBT 102. Thus, both the emitters 105 and 106 are connected to a common emitter 107. Because the second emitter 106 is provided only to monitor the current in the first IGBT 101, its size or area is generally much smaller than that of the first emitter 105.

The second emitter 106 is provided with a sensing resistor 108. Thus, the voltage applied to the gate 103 is controlled in accordance with the sense voltage Vs applied to the sensing resistor 108 (i.e. voltage drop due to the sensing resistor 108).

As shown in FIG. 8, in the conventional semiconductor device, the sense voltage Vs applied to the sensing resistor 108 is approximately proportional to the current flowing through the first emitter 105. Therefore, an over-current in the first IGBT 101 may be prevented by monitoring the sense voltage Vs and feeding back it to the gate 103.

As described above, the size or area of the second emitter 106 is very small while the capacity of the second IGBT 102 used as a current-sensing element is also very small. In consequence, there exists such a problem that the second IGBT 102 or the second emitter 106 is easily affected by an external circuit so that the second IGBT 102 or the second emitter 106 may be destroyed due to an over-voltage or the like according to the situation. As an example of the destruction described above, for example, there may be pointed out such a case that an voltage higher than the voltage of endurance (breakdown voltage) is generated between the first emitter 105 and the second emitter 106.

It goes without saying that the above-mentioned problems may occur also in a power transistor of a voltage-driven type such as a MOSFET other than the IGBT.

SUMMARY OF THE INVENTION

The present invention, which has been developed to solve the conventional problems described above, has an object to provide a means for an insulated-gate transistor such as an IGBT, a MOSFET or the like incorporating a current-sensing element for preventing a over-current, which can effectively prevent the over-current and further can effectively prevent destruction of the current-sensing element due to an over-voltage or the like.

A semiconductor device according to the present invention includes a first transistor of an insulated-gate type (e.g. IGBT, MOSFET or the like) and a second transistor of an insulated-gate type (e.g. IGBT, MOSFET or the like). The first transistor controls a principal current while the second transistor monitors a current flowing through the first transistor. Hereupon, the term "principal current" means the current flowing through an external load which is controlled by the semiconductor device. Both the transistors are formed in a common semiconductor substrate. In addition, both the transistors shear a common collector region and a common gate region to each other. An emitter region of the second transistor is smaller than an emitter region of the first transistor, as for their sizes or areas.

Further, the semiconductor device includes a sensing resistor disposed between the emitter region of the first transistor and the emitter region of the second transistor. A voltage applied to the common gate region (furthermore, a current flowing through the first transistor) is controlled in accordance with a sense voltage applied to the sensing resistor, namely a voltage drop due to the sensing resistor.

In addition, the semiconductor device includes a diode portion or diode device (i.e. clamping element). The diode portion is provided between the emitter region of the first transistor and the emitter region of the second transistor in parallel with the sensing resistor. Hereupon, the diode portion becomes a breakdown state when a voltage, which is lower than an endurance voltage (i.e. breakdown voltage) between both the emitter regions and is higher than an upper limit of the sense voltage, is applied thereto. In consequence, an over-current of the first transistor may be effectively prevented by monitoring the sense voltage of the second transistor. In addition, the second transistor may be surely prevented from being destroyed by an overvoltage.

Alternatively, the diode portion may become a conductive state when the voltage, which is lower than the endurance voltage and is higher than the upper limit of the sense voltage, is applied thereto. In this case also, the over-current of the first transistor may be effectively prevented, and further the second transistor may be surely prevented from being destroyed.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which:

FIG. 3A is a top plan view of the diode portion of the semiconductor device shown in FIG. 2, while

FIG. 6A is a top plan view of the diode portion of the semiconductor device shown in FIG. 5, while

DETAILED DESCRIPTION OF THE PREFERRED EMBODIMENTS (Embodiment 1)

Hereinafter, Embodiment 1 of the present invention will be described.

Figure 1:
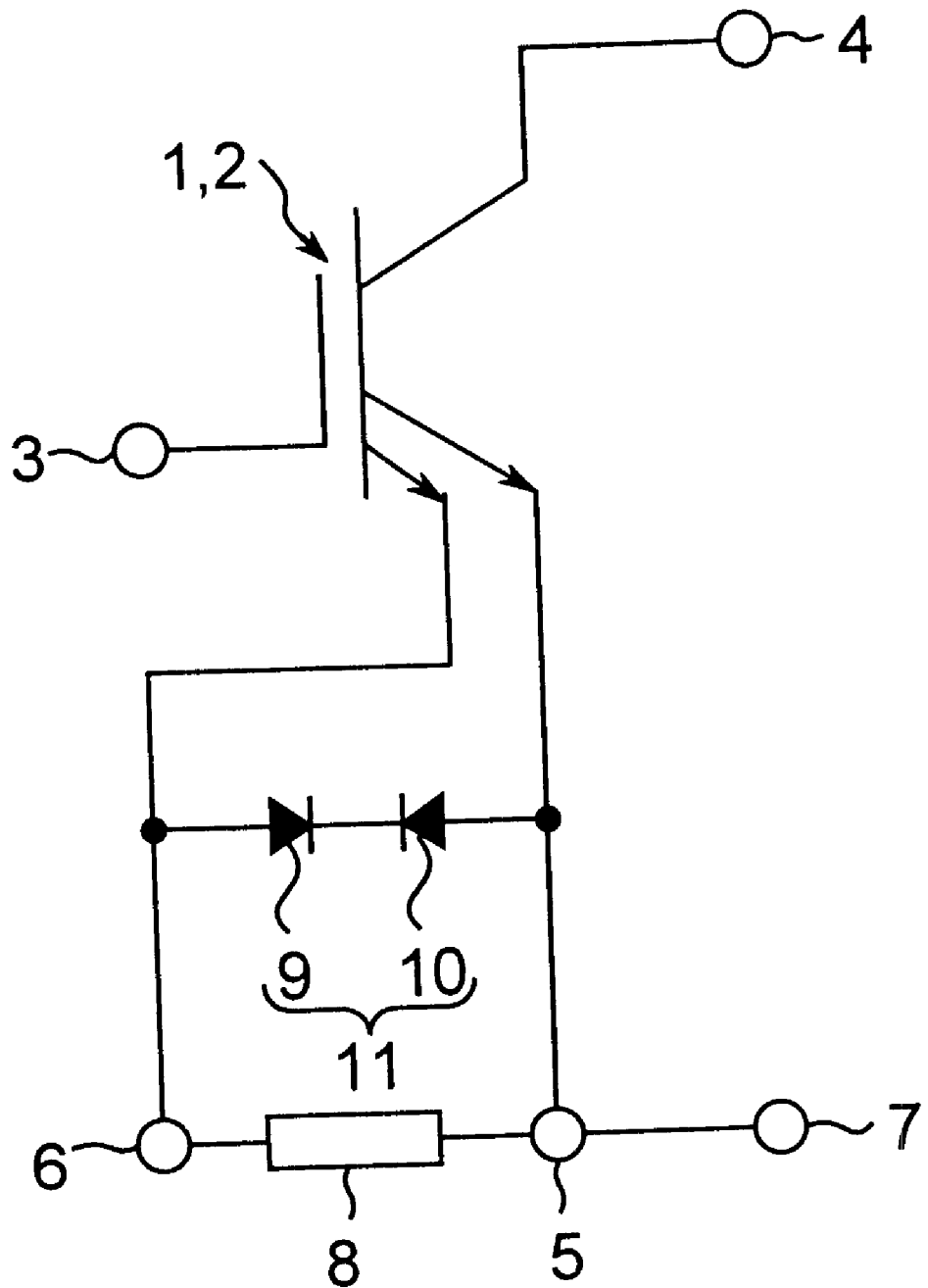
FIG. 1 is a circuit diagram showing the construction of a semiconductor device (IGBT) according to Embodiment 1 of the present invention.

FIG. 1 shows the construction of a semiconductor device (IGBT) according to Embodiment 1 of the present invention. As shown in FIG. 1, in the semiconductor device according to Embodiment 1, a first IGBT 1 for controlling a principal current and a second IGBT 2 for monitoring the current flowing through the first IGBT 1 are formed together on one common semiconductor substrate (see FIG. 2). Hereupon, the term "principal current" means the current flowing through an external load controlled (e.g. ON/OFF control) by the semiconductor device or flowing through a circuit connected to the external load.

The semiconductor device has a gate 3 (gate region) and a collector 4 (collector region) each of which is owned in common by both the IGBTs 1 and 2. That is, one common gate 3 and one common collector 4 are provided for both the IGBTs 1 and 2. On the other hand, each of the IBGTs 1 and 2 has a respective emitter (emitter region). That is, the first IGBT 1 has a first emitter 5 (first emitter region) while the second IGBT 2 has a second emitter 6 (second emitter region). The first emitter 5 is connected to a common emitter 7. Because the second emitter 6 is provided only to monitor or detect the current in the first IGBT 1, its size or area is much smaller than that of the first emitter 5.

A sensing resistor 8 is interposed in a conducting wire connecting the first emitter 5 to the second emitter 6. In the semiconductor device, in response to the sense voltage Vs applied to the sensing resistor 8, namely the voltage drop due to the sensing resistor 8, the voltage applied to the gate 3 is controlled so that the current flowing through both the IGBTs 1 and 2 is controlled. In the semiconductor device, fundamentally, the sense voltage Vs applied to the sensing resistor 8 increases in proportion with the current flowing through the first emitter 5

Therefore, an over-current of the first IGBT 1 may be prevented by monitoring the sense voltage Vs and feeding back it to the gate 3. For example, when the sense voltage Vs rises to a predetermined upper limit voltage or threshold voltage, the voltage applied to the gate 3 is fixed to 0 V so that each of the IGBTs 1 and 2 becomes the OFF state. In consequence, the circuit in which both the IGBTs 1 and 2 are interposed, is shut off so that it is prevented that an over-current flows through the circuit (or both the IGBTs 1 and 2).

Moreover, in the semiconductor device, a diode portion or diode device 11 (clamping element) composed of a first diode 9 and a second diode 10 is provided or connected between the first emitter 5 of the first IGBT 1 and the second emitter 6 of the second IGBT 2 so as to be in parallel with the sensing resistor 8. The diode portion 11 has such an endurance property that it becomes a breakdown state when a voltage, which is lower than the endurance voltage (breakdown voltage) between both the emitters 5 and 6 and is higher than the upper limit of the sense voltage Vs, is applied thereto.

Hereinafter, the construction and function of the diode portion 11 (diode device) will be specifically described. In the diode portion 11, the first and second diodes 9 and 10 are connected in series with each other such that the reverse voltage direction of the first diode 9 coincides with the direction from the first emitter 5 toward the second emitter 6 while the reverse voltage direction of the second diode 10 coincides with the direction from the second emitter 6 toward the first emitter 5. That is, both the diodes 9 and 10 are connected in reverse series with each other. The breakdown voltage or endurance voltage of each of the diodes 9 and 10 in its reverse voltage direction (referred to "diode breakdown voltage" hereinafter) is set so as to be lower than the endurance voltage between both the emitters 5 and 6 (referred to "emitter endurance voltage" hereinafter) and be higher than the upper limit or threshold of the sense voltage Vs (referred to "upper limit sense voltage" hereinafter).

If the voltage applied between the first emitter 5 and the second emitter 6 is not higher than the diode breakdown voltage, the diode portion 11 holds the OFF state. That is, when the voltage of the first emitter 5 is higher than the voltage of the second emitter 6, the first diode 9 prevents that the current flows from the first emitter 5 to the second emitter 6 through the diode portion 11. On the other hand, when the voltage of the second emitter 6 is higher than the voltage of the first emitter 5, the second diode 10 prevents that the current flows from the second emitter 6 to the first emitter 5 through the diode portion 11. In this case, the second IGBT 2 prevents an over-current of the first IGBT 1 by monitoring the sense voltage Vs and further feeding back it to the gate 3.

However, if an over-voltage, which is higher than the diode breakdown voltage, occurs between the first emitter 5 and the second emitter 6 due to the influence of the external circuit or the like, one or the other of the first and second diodes 9 and 10, to which a reverse voltage is applied, becomes the breakdown state so that the diode portion 11 becomes a conductive state. That is, when the voltage of the first emitter 5 is higher than the voltage of the second emitter 6, the first diode 9 to which the reverse voltage is applied, causes a breakdown to become a conductive state.

Meanwhile, the second diode 10 to which the forward voltage is applied, holds the conductive state as a matter of course. Consequently, the diode portion 11 becomes the conductive state.

On the other hand, when the voltage of the second emitter 6 is higher than the voltage of the first emitter 5, the second diode 10 to which the reverse voltage is applied, causes a breakdown to become a conductive state. Meanwhile, the first diode 9 to which the forward voltage is applied, holds the conductive state as a matter of course. Consequently, the diode portion 11 becomes the conductive state.

In that case, because the diode portion 11 is conductive, the voltages (electrical potentials) of the first and second emitters 5 and 6 are substantially identical to each other so that the over-voltage may be dissolved. Therefore, the voltage between the first emitter 5 and the second emitter 6 does not exceed the diode breakdown voltage. Because the diode breakdown voltage is lower than the emitter endurance voltage as described above, the voltage applied between the first emitter 5 and the second emitter 6 does not rise to the emitter endurance voltage. In consequence, the destruction of the second IGBT 2 due to the over-voltage may be surely prevented.

Meanwhile, because the diode breakdown voltage is higher than the upper limit sense voltage as described above, the diode portion 11 does not prevent at all the original function of the device to monitor the sense voltage Vs of the second IGBT 2 and further to prevent the over-current of the first IGBT 1.

As described above, in the semiconductor device according to Embodiment 1, the over-current of the first IGBT 1 may be effectively prevented by monitoring the sense voltage Vs of the second IGBT 2, and further the destruction of the second IGBT 2 due to the over-voltage may be surely prevented.

(Embodiment 2)

Figure 2:
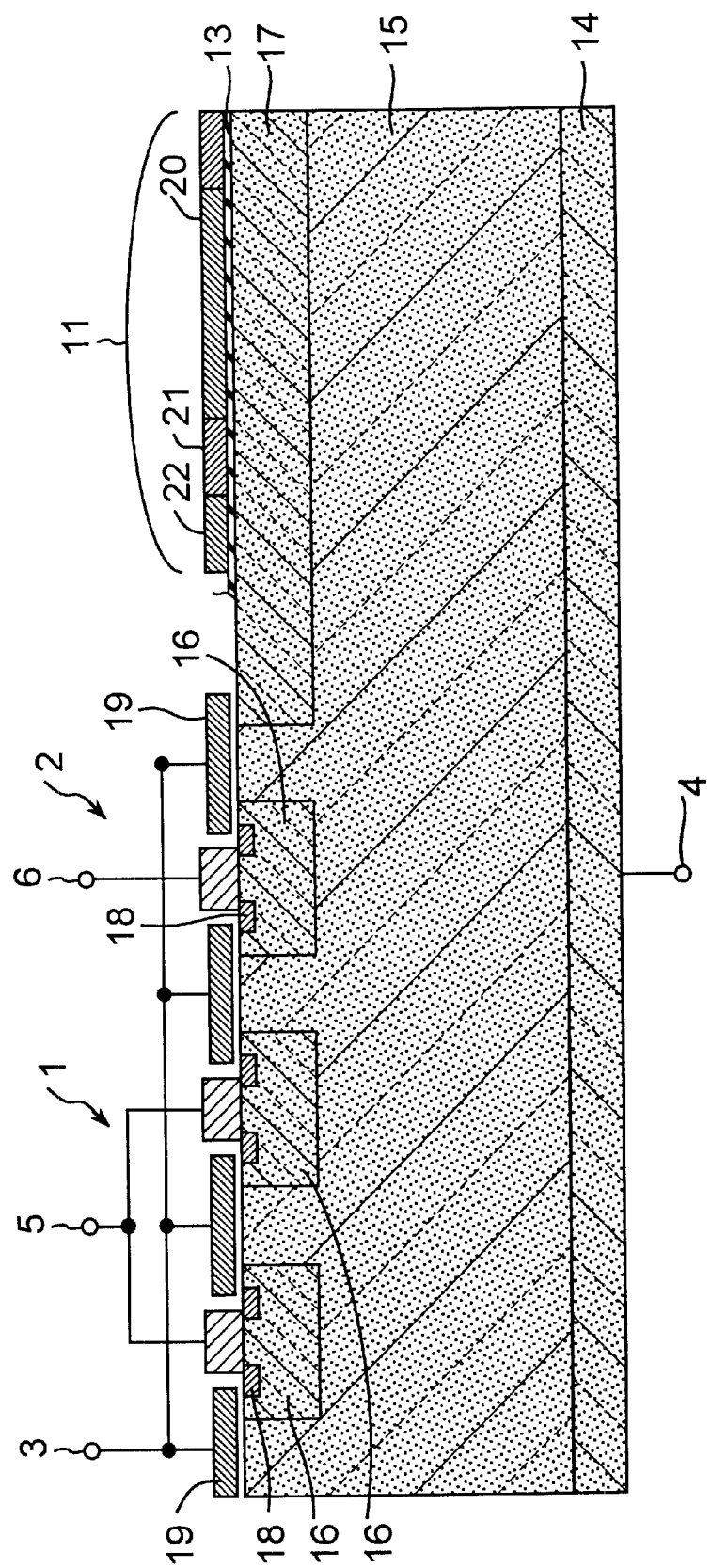
FIG. 2 is a sectional elevation view of a semiconductor device (IGBT) according to Embodiment 2 of the present invention.
Figure 3A:
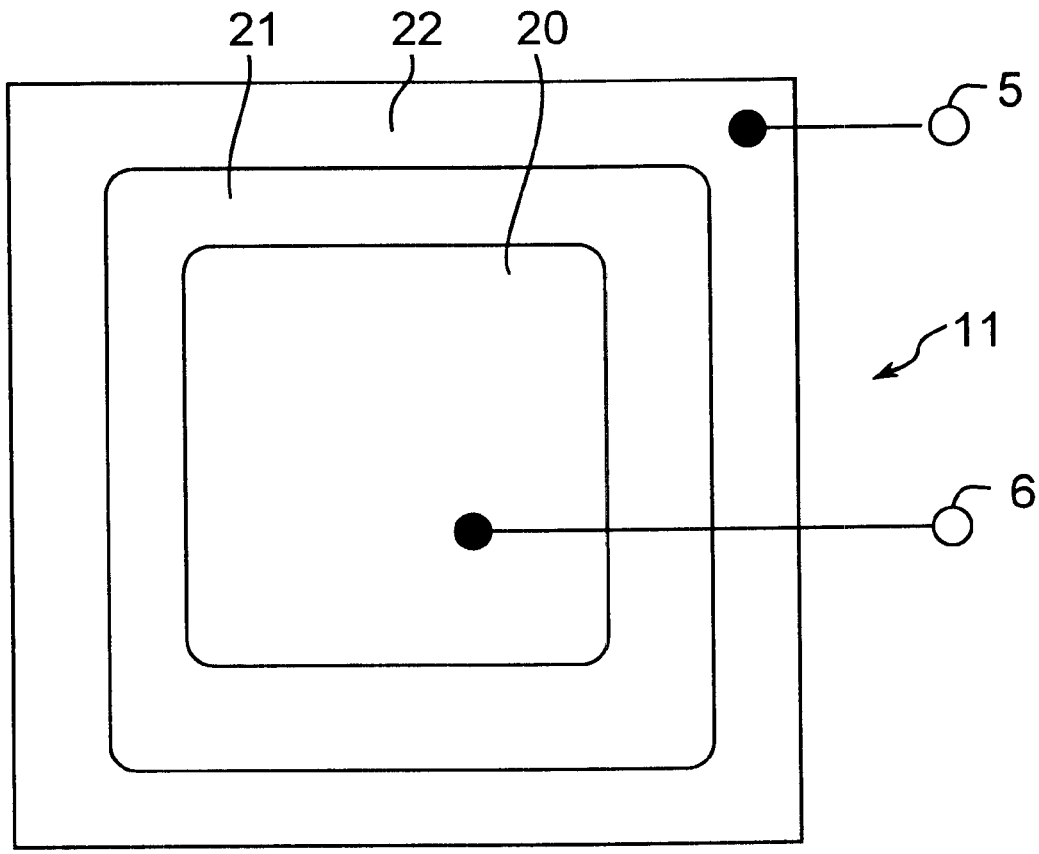
Figure 3B:
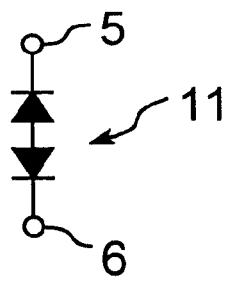
FIG. 3B is a circuit diagram which is equivalent to the diode portion shown in FIG. 3A.

Hereinafter, a semiconductor device according to Embodiment 2 of the present invention will be described with reference to FIGS. 2, 3A and 3B. However, the fundamental construction of the semiconductor device according to Embodiment 2 is common with that of the semiconductor device according to Embodiment 1. Therefore, in order to avoid duplicate descriptions, differences between Embodiments 2 and 1 will be mainly described hereinafter. In FIGS. 2, 3A and 3B, members in common with those of the semiconductor device according to Embodiment 1 shown in FIG. 1 have reference numerals as same as those in FIG. 1.

As shown in FIGS. 2, 3A and 3B, in the semiconductor device according to Embodiment 2, the diode portion 11 is incorporated in or integrally formed with the semiconductor device (semiconductor substrate), and further is composed of a polysilicon formed on an insulating film 13 on the semiconductor substrate. The above-mentioned features are the only differences between the semiconductor device according to Embodiment 2 and the semiconductor device according to Embodiment 1. The other features of the semiconductor device according to Embodiment 2 are substantially as same as those of the semiconductor device according to Embodiment 1.

Hereinafter, the construction of the semiconductor device according to Embodiment 2 will be specifically described. The semiconductor substrate of the semiconductor device is substantially composed of a P collector layer 14 connected to the collector 4 which is common with both the IGBTs 1 and 2, an N base layer 15 disposed on the P collector layer 14, P base layers 16 of the IGBT side and a P base layer 17 of the diode side each of which is formed in the N base layer 15, and N+ emitter layers 18 formed in the P base layers 16 of the IGBT side. The emitter 5 or 6 of each of the IGBTs 1 and 2 is connected to the corresponding N+ emitter layers 18, respectively. Each gate layer 19 of the gate 3 in common with both the IGBTs 1 and 2 is disposed above the semiconductor substrate so as to sandwich an insulating film (not shown) between the layers 19 and the substrate.

Above the P base layer 17 of the diode side having an electrical potential identical to that of the first emitter 5, the diode portion 11 is formed so as to sandwich the insulating layer 13 between the diode portion 11 and the layer 17. The diode portion 11 is composed of an N-type polysilicon layer 20, a P-type polysilicon layer 21 and an N-type polysilicon layer 22. In the plan view, the N-type polysilicon layer 20 is disposed at the central position of the diode portion 11. The P-type polysilicon layer 21 contacts the outer edge of the N-type polysilicon layer 20 so as to surround the layer 20. The N-type polysilicon layer 22 contacts the outer edge of the P-type polysilicon layer 21 so as to surround the layer 21. Further, the N-type polysilicon layer 20, which is disposed at the inner side in the plan view, is connected to the second emitter 6 through an aluminum electrode or the like. On the other hand, the N-type polysilicon layer 22, which is disposed at the outer side, is connected to the first emitter 5 through an aluminum electrode or the like. Therefore, the diode portion 11 has such a circuit construction as shown in FIG. 3B.

Thus, the semiconductor device according to Embodiment 2 may become compact while the number of the components of the semiconductor device may be reduced, because the diode portion 11 is incorporated in or integrally formed with the semiconductor device (semiconductor substrate). Further, because the diode portion 11 is composed of the polysilicon layers 20 to 22 formed on the insulating film 13, the process for manufacturing the semiconductor device becomes simple or easy so that the cost for manufacturing the semiconductor device may be reduced.

As described above, in the semiconductor device according to Embodiment 2, the diode portion 11 is incorporated in or integrally formed with the semiconductor device and composed of the polysilicon layers formed on the insulating film 13 on the semiconductor substrate. However, the circuit construction of the semiconductor device is substantially as same as that of the semiconductor device according to Embodiment 1 shown in FIG. 1. Therefore, in the semiconductor device according to Embodiment 2 also, the over-current of the first IGBT 1 may be effectively prevented by monitoring the sense voltage Vs of the second IGBT 2, and further the destruction of the second IGBT 2 due to the over-voltage may be surely prevented, as same as the case of the semiconductor device according to Embodiment 1.

(Embodiment 3)

Figure 4:
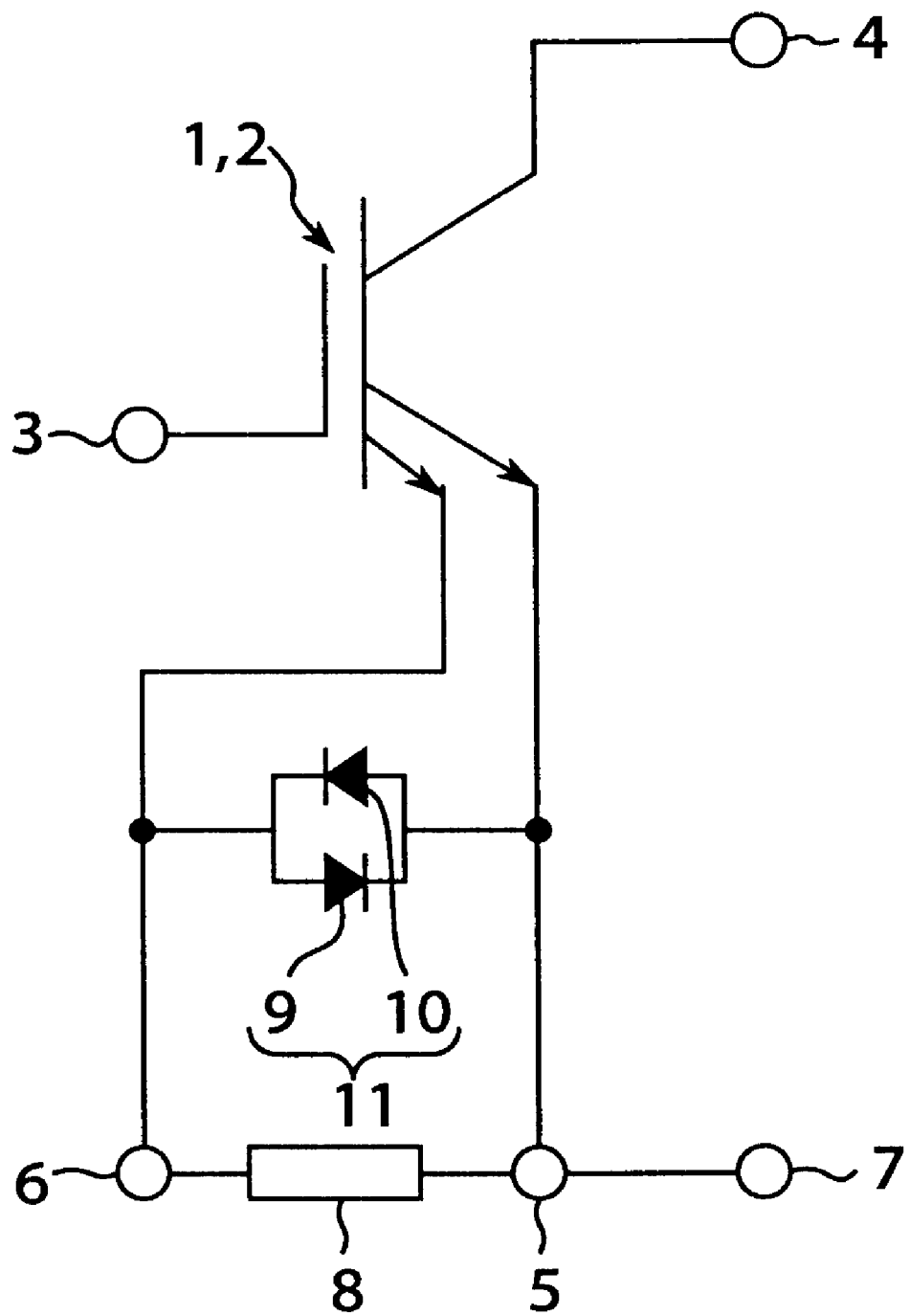
FIG. 4 is a circuit diagram showing the construction of a semiconductor device (IGBT) according to Embodiment 3 of the present invention.

Hereinafter, a semiconductor device according to Embodiment 3 of the present invention will be described with reference to FIG. 4. However, the fundamental construction of the semiconductor device according to Embodiment 3 is common with that of the semiconductor device according to Embodiment 1. Therefore, in order to avoid duplicate descriptions, differences between Embodiments 3 and 1 will be mainly described hereinafter. In FIG. 4, members in common with those of the semiconductor device according to Embodiment 1 shown in FIG. 1 have reference numerals as same as those in FIG. 1.

As shown in FIG. 4, in the semiconductor device according to Embodiment 3, the diode portion 11 has such a conductive property that the diode portion 11 becomes a conductive state when a voltage, which is lower than the emitter endurance voltage (breakdown voltage) and is higher than the upper limit sense voltage, is applied to the diode portion 11. The semiconductor device according to Embodiment 1 (Embodiment 2 also) is characterized in that it utilizes the endurance property of the diodes 9 and 10 in the reverse voltage direction. On the other hand, the semiconductor device according to Embodiment 3 is characterized in that it utilizes the conductive property of the diodes in the forward voltage direction. That is the only difference between the semiconductor device according to Embodiment 3 and the semiconductor device according to Embodiment 1. The other features of the semiconductor device according to Embodiment 3 are substantially as same as those of the semiconductor device according to Embodiment 1.

Hereinafter, the construction and function of the diode portion 11 of the semiconductor device according to Embodiment 3 will be specifically described. In the diode portion 11, the first and second diodes 9 and 10 are connected in parallel with each other such that the forward voltage direction of the first diode 9 coincides with the direction from the second emitter 6 toward the first emitter while the forward voltage direction of the second diode 10 coincides with the direction from the first emitter 5 toward the second emitter 6. That is, both the diodes 9 and 10 are connected in reverse parallel with each other. The conductive voltage of each of the diodes 9 and 10 in its forward voltage direction (referred to "diode conduction voltage" hereinafter) is set so as to be lower than the emitter endurance voltage and be higher than the upper limit sense voltage. Hereupon, each of the diodes 9 and 10 is not conductive when a voltage, which is lower than the diode conduction voltage, is applied to the diode in the forward voltage direction.

If the voltage applied between the first emitter 5 and the second emitter 6 is not higher than the diode conduction voltage, the diode portion 11 holds the OFF state. That is, even if the voltage of the first emitter 5 is higher than the voltage of the second emitter 6, the second diode 10, to which the forward voltage is applied, is not conductive while the first diode 9, to which the reverse voltage is applied, does not break down. In consequence, there is no current which flows from the first emitter 5 to the second emitter 6 through the diode portion 11. On the other hand, even if the voltage of the second emitter 6 is higher than the voltage of the first emitter 5, the first diode 9, to which the forward voltage is applied, is not conductive while the second diode 10, to which the reverse voltage is applied, does not break down. In consequence, there is no current which flows from the second emitter 6 to the first emitter 5 through the diode portion 11. In that case, the second IGBT 2 prevents the over-current of the first IGBT 1 by monitoring the sense voltage Vs and feeding back it to the gate 3.

However, if an over-voltage, which is higher than the diode conduction voltage, occurs between the first emitter 5 and the second emitter 6 due to the influence of the external circuit or the like, one or the other of the first and second diodes 9 and 10, to which a forward voltage is applied, becomes conductive so that the diode portion 11 becomes a conductive state. That is, when the voltage of the first emitter 5 is higher than the voltage of the second emitter 6, the second diode 10 to which the forward voltage is applied, becomes conductive so that the diode portion 11 becomes the conductive state. On the other hand, when the voltage of the second emitter 6 is higher than the voltage of the first emitter 5, the first diode 9 to which the forward voltage is applied, becomes conductive so that the diode portion 11 becomes the conductive state.

In that case, because the diode portion 11 is conductive, the voltages of the first and second emitters 5 and 6 are substantially identical to each other so that the over-voltage may be dissolved. Therefore, the voltage between the first emitter 5 and the second emitter 6 does not exceed the diode conduction voltage. Because the diode conduction voltage is lower than the emitter endurance voltage as described above, the voltage applied between the first emitter 5 and the second emitter 6 does not rise to the emitter endurance voltage. In consequence, the destruction of the second IGBT 2 due to the over-voltage may be prevented.

Meanwhile, because the diode conduction voltage is higher than the upper limit sense voltage as described above, the diode portion 11 does not prevent at all the original function of the device to monitor the sense voltage Vs of the second IGBT 2 and further to prevent the over-current of the first IGBT 1.

As described above, in the semiconductor device according to Embodiment 3, the over-current of the first IGBT 1 may be effectively prevented by monitoring the sense voltage Vs of the second IGBT 2, and further the destruction of the second IGBT 2 due to the over-voltage may be surely prevented.

In general, a diode conduction voltage or the conductive property of a diode in the forward voltage direction less fluctuates in comparison with the endurance property of the diode in the reverse voltage direction. Therefore, the semiconductor device according to Embodiment 3 has such an advantage that it can particularly stabilize the action of the diode portion 11. Further, in the semiconductor device according to Embodiment 3, if each of the diodes 9 and 10 is composed of a diode array in which a plurality of diode elements are connected in series in the same direction, the diode conduction voltage (i.e. clamping condition) can be easily adjusted or changed by changing the number of the diode elements. Therefore, there may be obtained such an advantage that the diode conduction voltage can be meticulously set.

(Embodiment 4)

Figure 5:
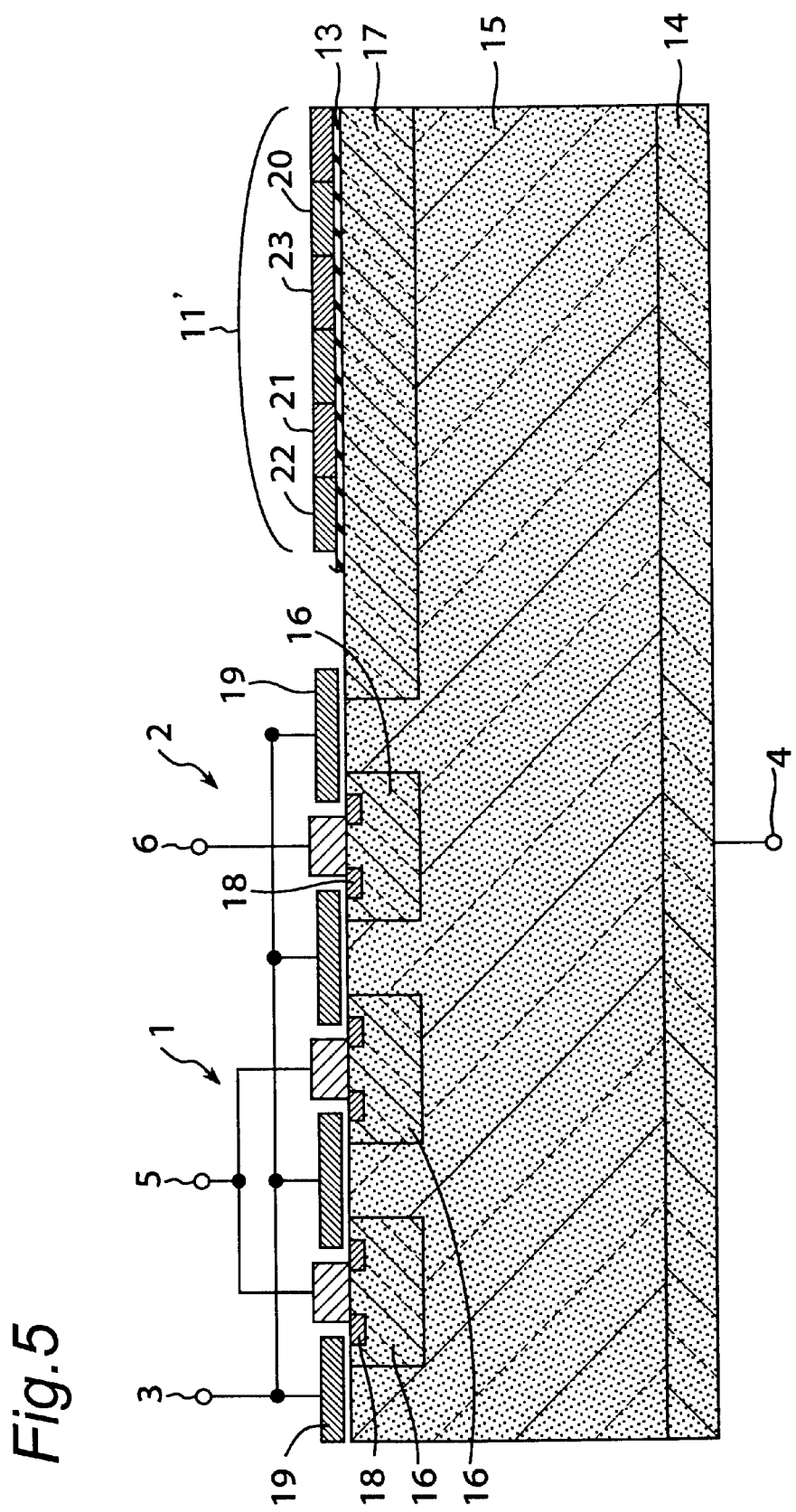
FIG. 5 is a sectional elevation view of a semiconductor device (IGBT) according to Embodiment 4 of the present invention.
Figure 6A:
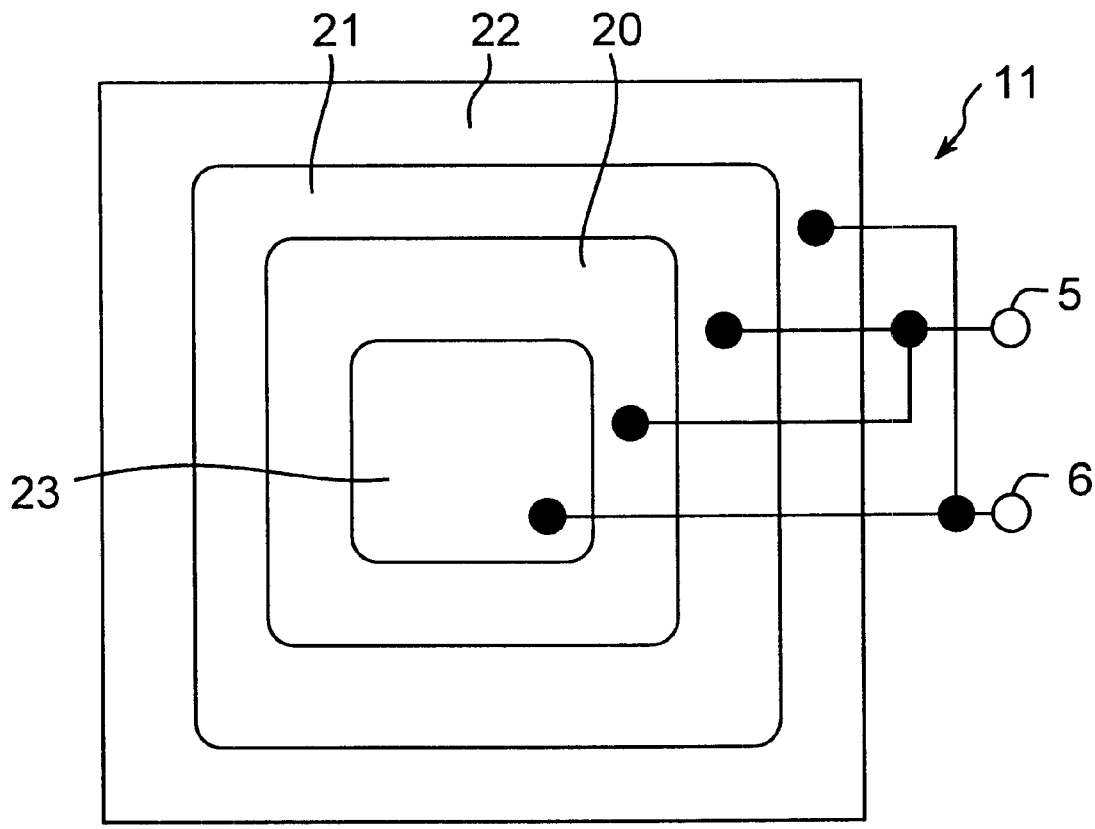
Figure 6B:
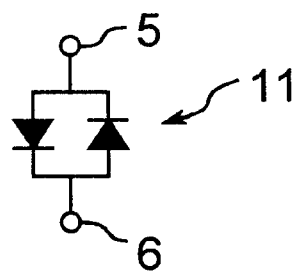
FIG. 6B is a circuit diagram which is equivalent to the diode portion shown in FIG. 6A.
Figure 7:
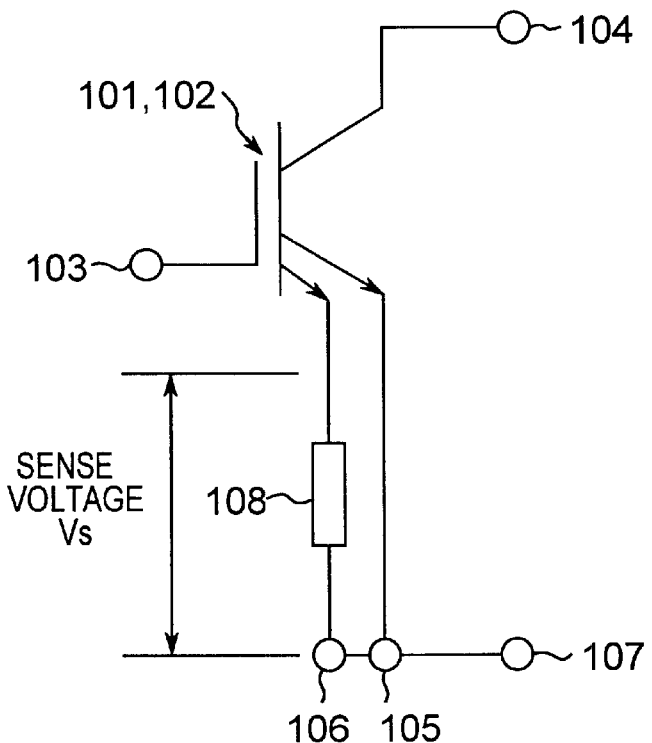
FIG. 7 is a circuit diagram showing the construction of a conventional semiconductor device (IGBT)
Figure 8:
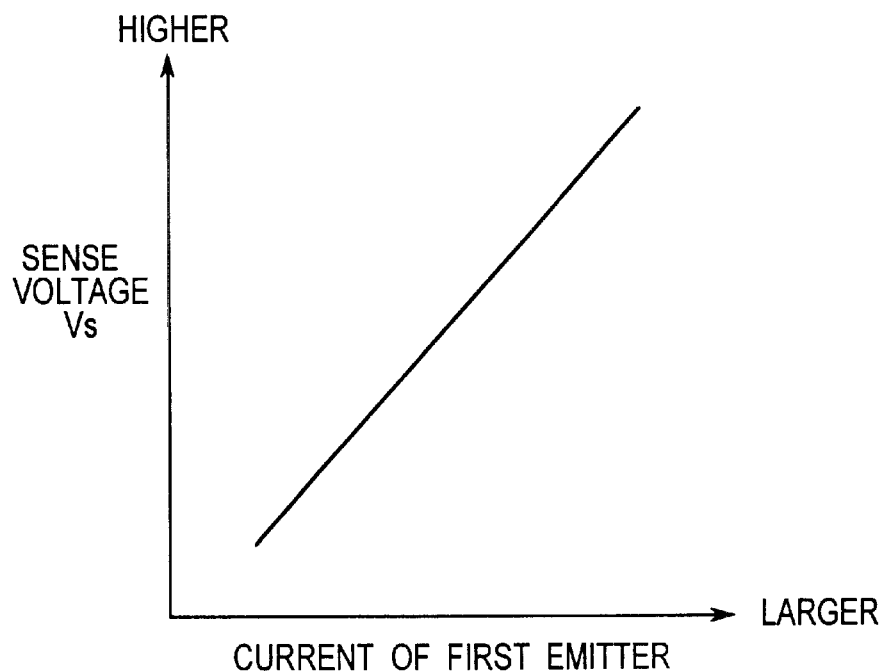
FIG. 8 is a graph showing the relation between the sense voltage and the current of the first emitter in the semiconductor device shown in FIG. 7.

Hereinafter, a semiconductor device according to Embodiment 4 of the present invention will be described with reference to FIGS. 5, 6A and 6B. However, in the semiconductor device according to Embodiment 4, its physical construction is fundamentally common with that of the semiconductor device according to Embodiment 2 while the circuit construction is fundamentally common with that of the semiconductor device according to Embodiment 3. Therefore, in order to avoid duplicate descriptions, differences between Embodiments 4 and Embodiment 2 or 3 will be mainly described hereinafter. In FIGS. 5, 6A and 6B, members in common with those of the semiconductor device according to Embodiment 2 shown in FIGS. 2, 3A and 3B or members in common with those of the semiconductor device according to Embodiment 3 shown in FIG. 4 have reference numerals as same as those in FIGS. 2 to 4

As shown in FIGS. 5, 6A and 6B, in the semiconductor device according to Embodiment 4, the diode portion 11 is incorporated in or integrally formed with the semiconductor device (semiconductor substrate), and further is composed of a polysilicon formed on the insulating film 13 on the semiconductor substrate. The above-mentioned features are the only differences between the semiconductor device according to Embodiment 4 and the semiconductor device according to Embodiment 3.

Meanwhile, in the semiconductor device according to Embodiment 4, a P-type polysilicon layer 23 is provided inside the N-type polysilicon layer 20 disposed at the inner position in the plan view. The P-type polysilicon layer 23 is disposed at the central position. The N-type polysilicon layer 20 contacts the outer edge of the P-type polysilicon layer 23 so as to surround the layer 23. Each of the P-type polysilicon layer 23 disposed at the central position and the N-type polysilicon layer 22 disposed at the outer side is connected to the second emitter 6 through an aluminum electrode or the like. On the other hand, each of the N-type polysilicon layer 20 and the P-type polysilicon 21 is connected to the first emitter 5 through an aluminum electrode or the like. Therefore, the diode portion 11 has such a circuit construction as shown in FIG. 6B. The above-mentioned features are the only differences between the semiconductor device according to Embodiment 4 and the semiconductor device according to Embodiment 2.

The other features of the semiconductor device according to Embodiment 4 are substantially as same as those of the semiconductor device according to Embodiment 2 or 3.

Thus, the semiconductor device according to Embodiment 4 may become compact while the number of the components of the semiconductor device may be reduced, because the diode portion 11 is incorporated in or integrally formed with the semiconductor device (semiconductor substrate). Further, because the diode portion 11 is composed of the polysilicon layers 20 to 23 formed on the insulating film 13, the process for manufacturing the semiconductor device becomes simple or easy so that the cost for manufacturing the semiconductor device may be reduced.

As described above, in the semiconductor device according to Embodiment 4, the diode portion 11 is incorporated in or integrally formed with the semiconductor device and composed of the polysilicon layers formed on the insulating film 13 on the semiconductor substrate. However, the circuit construction of the semiconductor device is substantially as same as that of the semiconductor device according to Embodiment 3 shown in FIG. 4. Therefore, in the semiconductor device according to Embodiment 4 also, the overcurrent of the first IGBT 1 may be effectively prevented by monitoring the sense voltage Vs of the second IGBT 2, and further the destruction of the second IGBT 2 due to the over-voltage may be surely prevented, as same as the case of the semiconductor device according to Embodiment 3.

In each of Embodiments 1 to 4 described above, on the semiconductor device, the IGBT which is a kind of insulated-gate transistor is formed. However, the insulated-gate transistor formed on the semiconductor device according to the present invention is not limited to the IGBT. It goes without saying that the same advantages as the above may be obtained even if another kind of insulated-gate transistor such as MOSFET or the like is formed on the semiconductor device.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device comprising:
   a first transistor of an insulated-gate type for controlling a principal current and a second transistor of an insulated-gate type for monitoring a current flowing through said first transistor, said transistors being formed in a common semiconductor substrate, said transistors sharing a common collector region and a common gate region to each other, and an emitter region of said second transistor being smaller than an emitter region of a said first transistor;
   a sensing resistor disposed between the emitter region of said first transistor and the emitter region of said second transistor, a voltage applied to the common gate region being controlled in accordance with a sense voltage applied to said sensing resistor; and
   a diode portion provided between the emitter region of said first transistor and the emitter region of said second transistor in parallel with said sensing resistor, wherein said diode portion has a breakdown voltage which is lower than a breakdown voltage between the emitter regions and is higher than an upper limit of the sense voltage.

2. The semiconductor device according to claim 1, wherein said diode portion is incorporated in said semiconductor substrate.

3. The semiconductor device according to claim 1, wherein said diode portion is comprised of a polysilicon formed on an insulating film on said semiconductor substrate.

4. A semiconductor device comprising:
   a first transistor of an insulated-gate type for controlling a principal current and a second transistor of an insulated-gate type for monitoring a current flowing through said first transistor, said transistors being formed in a common semiconductor substrate, said transistors sharing a common collector region and a common gate region to each other, and an emitter region of said second transistor being smaller than an emitter region of said first transistor;
   a sensing resistor disposed between the emitter region of said first transistor and the emitter region of said second transistor, a voltage applied to the common gate region being controlled in accordance with a sense voltage applied to said sensing resistor; and
   a diode portion provided between the emitter region of said first transistor and the emitter region of said second transistor in parallel with said sensing resistor, wherein said diode portion becomes conductive when a voltage, which is lower than a breakdown voltage between the emitter regions and is higher than an upper limit of the sense voltage, is applied thereto.

5. The semiconductor device according to claim 4, wherein said diode portion is incorporated in said semiconductor substrate.

6. The semiconductor device according to claim 4, wherein said diode portion is comprised of a polysilicon formed on an insulating film on said semiconductor substrate.

* * * * *